United States Patent [19]
Lutsic et al.

[11] Patent Number: 5,900,351
[45] Date of Patent: * May 4, 1999

[54] METHOD FOR STRIPPING PHOTORESIST

[75] Inventors: Rebecca Christine Lutsic, Johnson City; James Richard Murray, Owego; David William Sissenstein, Jr., Endwell, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/868,087

[22] Filed: Jun. 3, 1997

Related U.S. Application Data

[63] Continuation of application No. 08/373,526, Jan. 17, 1995, Pat. No. 5,691,117.

[51] Int. Cl.⁶ .............................. G03C 5/00; B08B 3/12; B08B 7/00
[52] U.S. Cl. ............................ 430/329; 134/1; 134/19; 134/21
[58] Field of Search ................... 134/1, 19, 21, 134/902; 216/63, 64, 67, 74, 79; 430/329; 438/715, 716, 725

[56] References Cited

U.S. PATENT DOCUMENTS

| | | | |
|---|---|---|---|
| 3,867,148 | 2/1975 | O'Keeffe et al. | 430/5 |
| 3,900,320 | 8/1975 | Rolker et al. | 430/324 |
| 4,340,456 | 7/1982 | Robinson et al. | 204/192.33 |
| 4,452,642 | 6/1984 | Dietz et al. | 134/1 |
| 4,539,222 | 9/1985 | Anderson et al. | 427/88 |
| 4,596,761 | 6/1986 | Brault | 430/296 |
| 4,874,646 | 10/1989 | Tsujino et al. | 428/34.1 |
| 4,994,412 | 2/1991 | Kalfus et al. | 438/123 |
| 5,241,454 | 8/1993 | Ameen et al. | 361/744 |
| 5,403,436 | 4/1995 | Fujimura et al. | 156/643 |
| 5,691,117 | 11/1997 | Lutsic et al. | 430/329 |

FOREIGN PATENT DOCUMENTS

| | | | |
|---|---|---|---|
| 0 305 946 A3 | 3/1989 | European Pat. Off. | G03F 7/26 |
| 0 345 757 A3 | 12/1989 | European Pat. Off. | H01L 21/31 |
| 4117341 | 5/1991 | Germany | C23G 5/00 |
| 5 6123 377 | 3/1980 | Japan | C23F 1/00 |

OTHER PUBLICATIONS

Aldrich Catalog, p. 966, 1994.
Advanced Semiconductor Expitaxial Growth Processes and Lateral and Vertical Fabrication, Malik et al., vol. 1676.
Stripping Today's Toughest Resists, Peters, vol. 15, No. 2.
"Removal of Polymerized Photoresists by Atomic and Molecular Hydrogen or Oxygen in a Discharge" by Tsui, et al., IBM Technical Disclosure Bulletin, vol. 9, No. 9, Feb. 1967.
"Resist Residue and Oxide Removal Prior to Plating, Lift-off and Etching" by Anderson, et al. IBM Technical Disclosure Bulletin, vol. 21, No. 3, Oct. 1978.

*Primary Examiner*—Bernard Codd
*Attorney, Agent, or Firm*—Calfee, Halter & Griswold LLP

[57] ABSTRACT

It has been discovered that organic photoresists may be quickly, coveniently, and completely stripped using a hot hydrogen atmosphere. The substrates are preferably exposed to such atmosphere utilizing a hydrogen conveyor furnace. The gases from the furnace are burned to carbon dioxide and water thereby eliminating the need to dispose of a stripping agent.

12 Claims, 4 Drawing Sheets

METHOD FOR STRIPPING PHOTORESIST

This is a continuation of application Ser. No. 08/373,526 filed on Jan. 17, 1995 now U.S. Pat. No. 5,691,117.

BACKGROUND OF THE INVENTION

Photoresist are employed in the manufacture of devices having a varying topology such as circuit patterns. Typically the photoresist is applied by various well known techniques and imaged through a mask using actinic radiation such as ultraviolet light. Photoresists can be either positive acting or negative acting. In the negative acting resists actinic radiation causes the exposed areas to polymerize. The non-polymerized areas of photoresist are removed in a solvent during development. In the positive acting resists, the opposite occurs, and the exposed areas are removed after development. The workpiece is then processed, typically the workpiece is etched to remove portions of the surface that are not protected by the photoresist or additive plating is performed. Thereafter, the remaining photoresist is stripped from the substrate typically using organic solvents. Such organic solvents are increasingly becoming the subject of governmental regulation. Moreover, stripping solvents are typically costly to dispose of and precautions must be taken to vent volatile solvents during use.

For example, to strip conventional polyisoprene photoresists, which are negative acting resists, chemical strippers containing perchloroethylene, o-dichlorobenzene, phenol, and dodecylbenzenesulfonic acid and solvents such as xylene and isopropanol are employed. These solvents are costly to dispose of off site, and under certain conditions fail to completely remove the photoresist. It is desirable to have an alternative stripping method to thoroughly remove photoresist that does not require costly disposal and which are more environmentally friendly than conventional stripping procedures.

SUMMARY OF THE INVENTION

It has been discovered that organic photoresists may be quickly, conveniently, and completely stripped without organic solvents, by using a hot hydrogen atmosphere. The substrates having the photoresist thereon are preferably exposed to such atmosphere utilizing a hydrogen atmosphere conveyor furnace. The process volatilizes the photoresist and the gases from the furnace are burned to carbon dioxide and water thereby eliminating the need to dispose of a stripping agent.

DETAILED DESCRIPTION OF THE INVENTION

Figure 1:
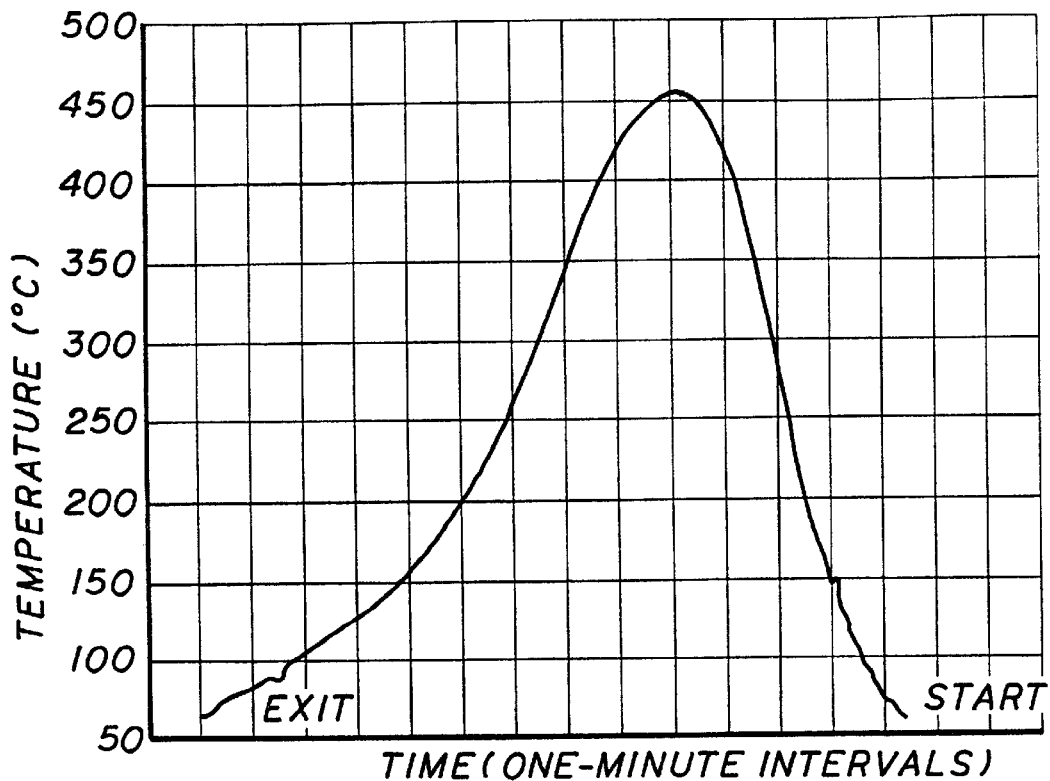
FIG. 1 is a time-temperature profile of 830A6B9D2E9 Lindberg hydrogen furnace used to strip a polyisoprene photoresist from metallized ceramic substrate.

The present invention provides a method for quickly, conveniently, and completely stripping organic photoresists without organic solvents, by using a hot hydrogen atmosphere. The substrates are preferably exposed to such atmosphere utilizing a hydrogen atmosphere conveyor furnace. The photoresist is volatilized and gases from the furnace are burned to carbon dioxide and water thereby eliminating the need to dispose of a stripping agent.

Organic photoresists, such as photoresists containing polyisoprenes are stripped from substrates by exposing the substrates to a hot hydrogen atmosphere. The hot hydrogen atmosphere strips photoresists that contain polyisoprene, also known as isoprenoid resins, particularly cyclized polyisoprenes and other photoresists referred to in *Photoresist*, by DeForest, McGraw-Hill (1975), particularly pages 31 to 34, which are specifically incorporated herein by reference. Most preferably the isoprene photoresist has an weight average molecular weight of about 60,000.

The photoresist may be stripped from a variety of substrates including metallized ceramic substrates and metallized ceramic polyimide substrates. The hydrogen atmosphere is preferably provided by a hydrogen furnace; suitable furnaces are available under the designations 47-MT-6482-20AMC-36 Serial 760123, type 830 ACB9D2E9 Serial 838965, and type 830 A18B14D1E6 and others from Lindberg, a division of general signal, Waterdown, Wisconsin, and Model FBE-3 from BTU, International North Sillerica, Massachusetts. Suitable furnace temperatures depend on the substrate, the photoresist, and exposure time. Typically the minimum temperature is about 300° C. Where the substrate is a metallized ceramic substrate, preferable temperatures range from about 430° to about 500° C, more preferably about 445° to about 470° C. Where the substrate is a metallized ceramic polyimide substrate, then preferable temperatures range from about 430° to about 480° C, more preferably 445° to about 470° C. Metallized ceramic polyimide typically means that a layer of polyimide is sandwiched between two layers of metallization on the ceramic substrate. While temperatures below 430° may be employed, they are typically not cost effective because the work piece would require a longer time in the furnace. Thus, as used herein "hot" hydrogen atmosphere means a hydrogen atmosphere greater than 300° C.

The length of exposure to the hydrogen atmosphere needed to strip the photoresists will vary depending upon the photoresist, its thickness, the substrate, the furnace, hydrogen flow rate, and the temperature. For photoresists such as polyisoprenes, exposure times from about 1 to about 4 minutes at temperatures above about 445° C., are generally suitable. While times greater than 4 minutes may be employed, they are typically less cost effective. While times less than 1 minute could be employed at higher temperatures, oxidation of the metal can result if the substrate is a metallized ceramic, and the exit temperature exceeds about 100° C. Similarly, where the substrate contains exposed metal, the oxygen content inside the furnace should not exceed about 10 parts per million.

EXAMPLE 1

A conventional cyclic polyisoprene photoresist available from London Chemical Company, Bensenville, Ill., under the designation KTFR was sprayed onto a metallized ceramic substrate. The metallization on the substrate has a layer of chromium, a layer of copper, and another layer of chromium. A mask was applied and the photoresist was exposed, then developed using xylene and n-butylacetate. The substrate was circuitized by etching the chromium-copper-chromium with potassium permanganate, then ferric chloride, then potassium permanganate, and then oxalic acid.

The substrate was exposed to a hot hydrogen atmosphere utilizing a conveyor hydrogen furnace type 830 ACB9D2E9 from Lindberg. The conveyor speed was 18.7 inches/minutes. The oxygen level was about 0.4 ppm and the hydrogen flow rate was about 200 SCFH. The time temperature profile is provided in FIG. 1. The peak temperature was 452° C. (450° C.–470° C.) and the exit temperature was less than 100°C.

EXAMPLE 2

A conventional cyclic polyisoprene photoresist available from Olin Hunt Co. under the designation WayCoat SC-100 was sprayed onto a metallized ceramic substrate. The metallization on the substrate was a layer of chromium, a layer of copper, and a layer of chromium. A mask was applied and the photoresist was exposed and then developed using xylene and n-butylacetate. Then the metallization on the substrate was etched as in Example 1 to produce a circuit pattern.

The substrate was exposed to a hot hydrogen atmosphere in a conveyor hydrogen furnace type 47-MT-6482-20AMC-36 from Lindberg. The conveyor speed was 11.5 inches/minutes. The oxygen level was about 0.4 ppm; the moisture level was about 12 ppm; and the hydrogen flow rate was about 200 SCFH.

Figure 2:
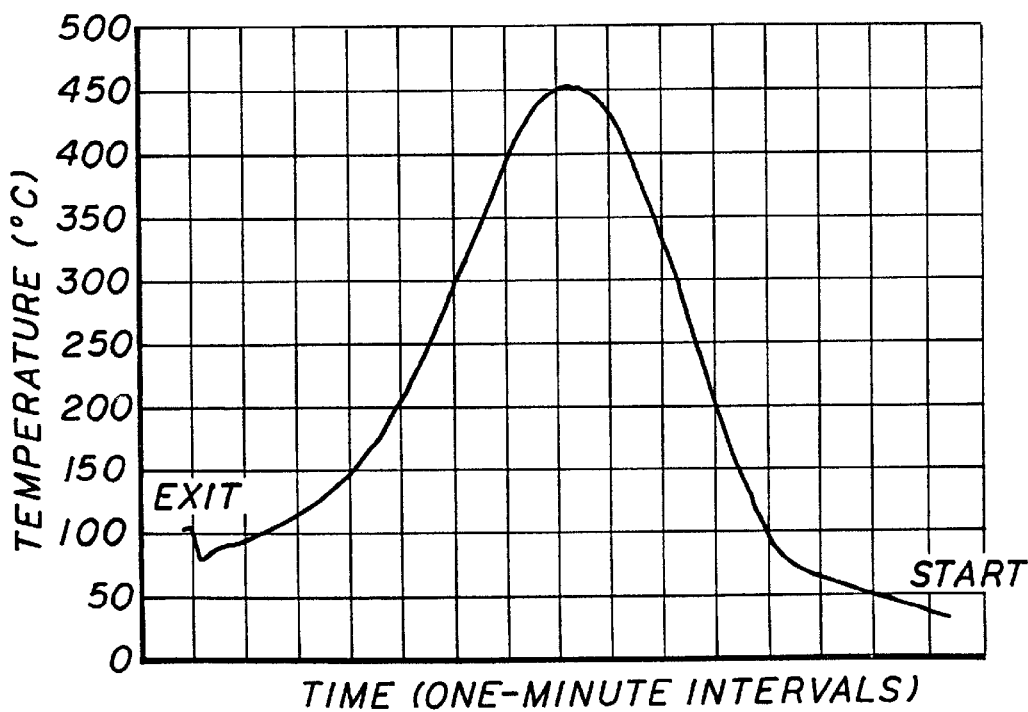
FIG. 2 is a time-temperature profile of 47-MT-6482-20AMC-3C Lindberg hydrogen furnace used to strip a polyisoprene photoresist from metallized ceramic polyimide substrate.

The substrate was then sprayed again with Waycoat SC-100, a different mask was applied and the photoresist exposed and developed as described above. The metallization was etched with potassium permanganate and oxalic acid thus exposing solderable copper lands on the metallurgy. The photoresist was then stripped from the substrates utilizing the same conditions as described above. The time-temperature profile is provided in FIG. 2.

EXAMPLE 3

Figure 3:
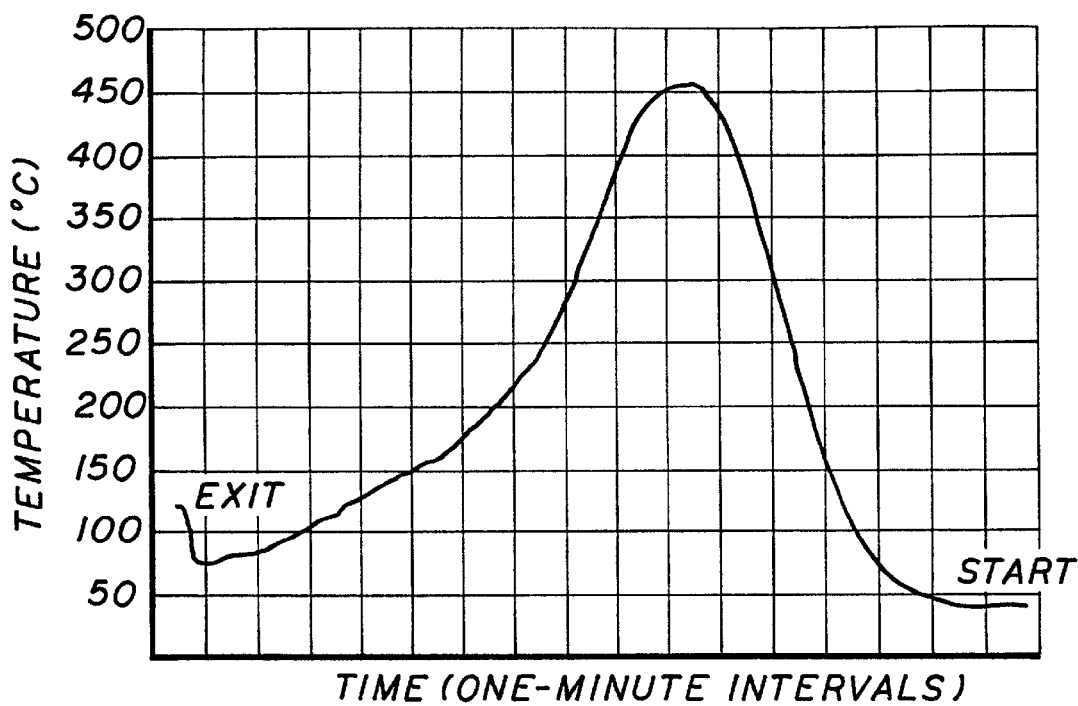
FIG. 3 is a time-temperature profile of 830A6B9D2E9 Lindberg hydrogen furnace used to strip a polyisoprene photoresist from metallized ceramic polyimide substrate.

A conventional cyclic polyisoprene photoresist available from Olin Hunt Co. under the designation Waycoat SC-100 was sprayed onto a metallized ceramic polyimide substrate. The metallization on the substrate was a layer of chromium, a layer of copper, a layer of chromium, a layer of polyimide and another layer of chromium, another layer of copper and another layer of chromium. A mask was applied and the photoresist was exposed then developed using methylchloroform and trifluorotrichloroethane. The metallization on the substrate was etched as in Example 1. The substrate was exposed to a hot hydrogen atmosphere in a conveyor hydrogen furnace type 830A6B9D2E9 from Lindberg. The conveyor speed was 20.6 inches/minutes. The oxygen level was about 1.0 ppm; the hydrogen level was 220 SCFH. The time-temperature profile is provided in FIG. 3.

EXAMPLE 4

Figure 4:
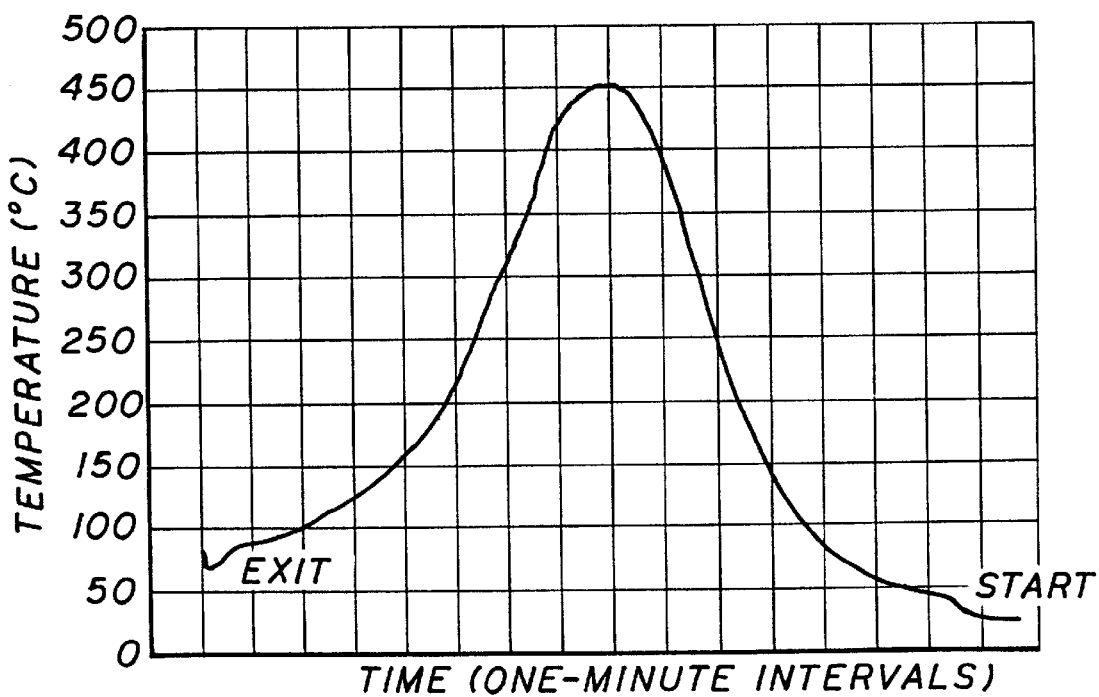
FIG. 4 is a time-temperature profile of 47-MT-6482-20AMC-3C Lindberg hydrogen furnace used to strip a polyisoprene photoresist from metallized ceramic polyimide substrate.

A conventional cyclic polyisoprene photoresist available from Olin Hunt Co. under the designation WayCoat SC-100 was sprayed onto a metallized ceramic polyimide substrate. A mask was applied and the photoresist was exposed then developed using methylchloroformand trifluorotrichloroethane. The metallization on the substrate was etched as in Example 1. The substrate was exposed to a hot hydrogen atmosphere in a conveyor hydrogen furnace type 47-MT-6482-20AMC-36. The conveyor speed was 11.5 in/min. The oxygen level was about 3.1 ppm; the hydrogen flow was about 210 SCFH. The time-temperature profile is provided in FIG. 4.

EXAMPLE 5

A conventional cyclic polyisoprene photoresist available from Olin Hunt Co. under the designation WayCoat SC-100 was sprayed onto a metallized ceramic substrate. A mask was applied and the photoresist was exposed then developed using methylchloroform and trifluorotrichloroethane. The metallization on the substrate was etched as in Example 1.

Figure 5:
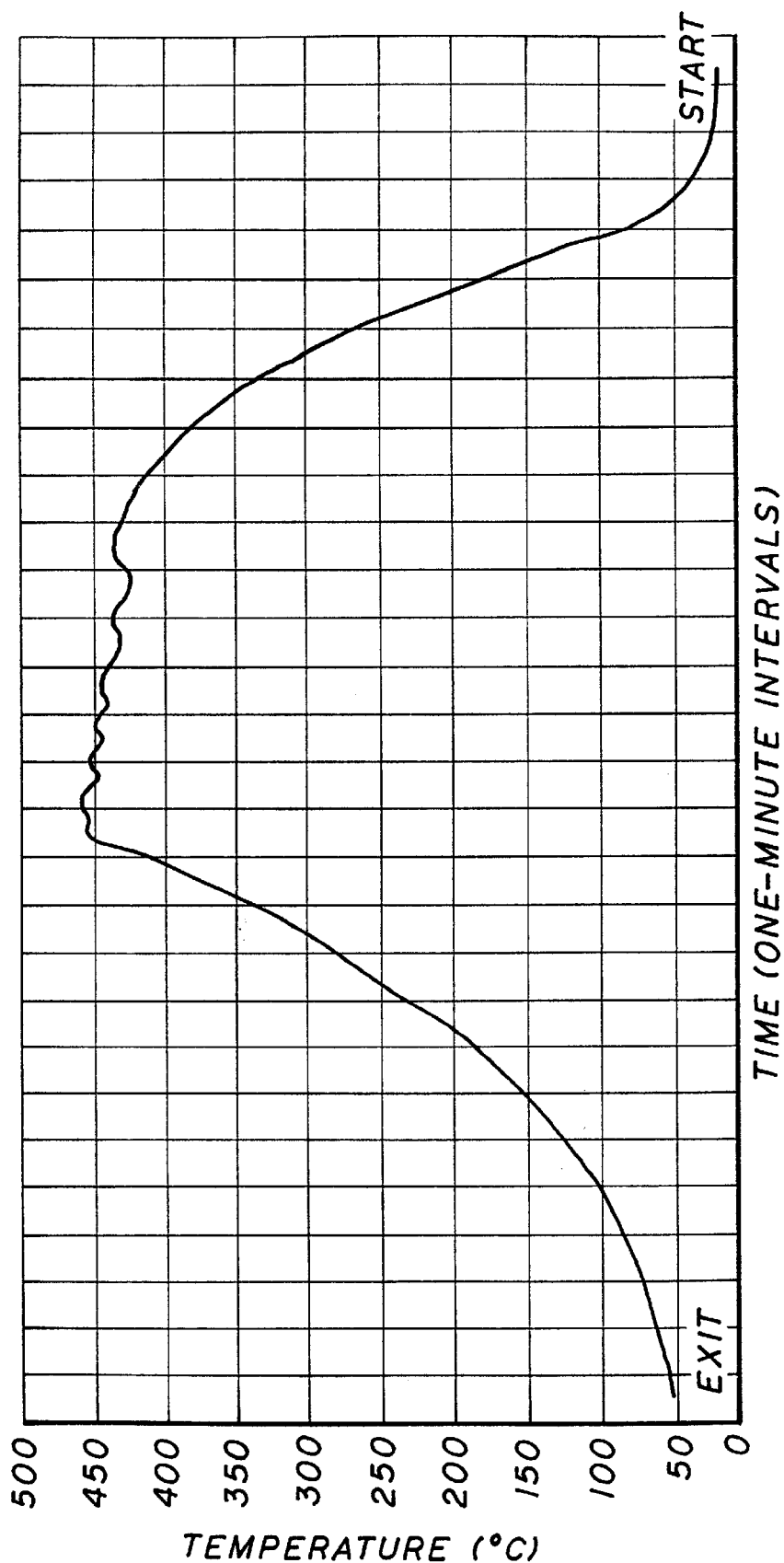
FIG. 5 is a time-temperature profile of a BTU FBE-3 hydrogen furnace used to strip a polyisoprene photoresist from metallized ceramic substrate.

The substrate was exposed to a hot hydrogen atmosphere in a conveyor hydrogen furnace type BTU FBE-3. The conveyor speed was 10.0 in/min. The oxygen level was about 1.0 ppm; the hydrogen level was about 120 LPM. The time-temperature profile is provided in FIG. 5.

EXAMPLE 6

A conventional cyclic polyisoprene photoresist available from Olin Hunt Co. under the designation WayCoat SC-100 was sprayed onto a metallized ceramic substrate. A mask was applied and the photoresist was exposed then developed using xylene and n-butylacetate. The metallization on the substrate was etched as in Example 1.

Figure 6:
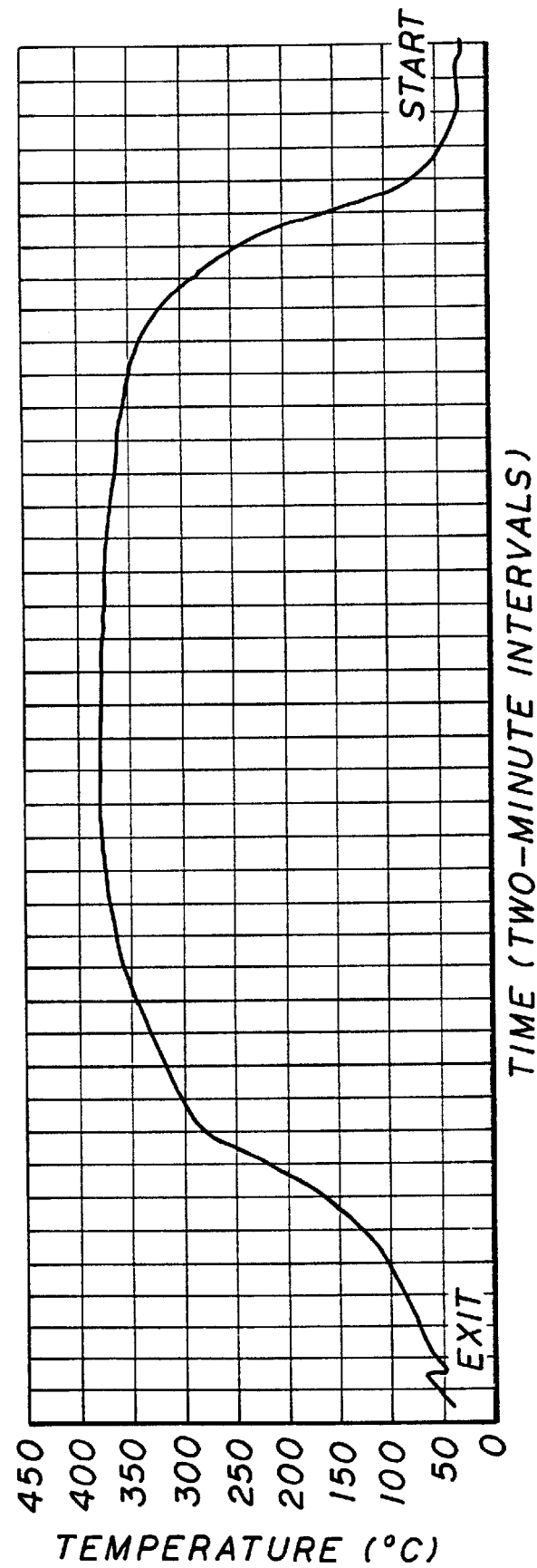
FIG. 6 is a time-temperature profile of a 47-MT-6482-20AMC-3C hydrogen furnace used to strip polyisoprene photoresist from metallized ceramic substrate.

The substrate was exposed to a hot hydrogen atmosphere in a conveyor hydrogen furnace type 47-MT-6482-20AMC-36. The conveyor speed was 0.9 in/min. The oxygen level was about 3.1 ppm; the hydrogen level was about 210 SCFH. The time-temperature profile is provided in FIG. 6.

EXAMPLE 7

A conventional cyclic polyisoprene photoresist available from London Chemical Company, Bensenville, Ill., under the designation KTFR, was sprayed onto a metallized ceramic substrate in which the metallization was composed of a layer chromium and a layer of copper; a second layer of chromium was not present as in the other examples. A mask was applied and the photoresist was exposed then developed using methylchloroform and trifluorotrichloroethane. The metallization on the substrate was etched as in Example 1, except that a first etch in potassium permanganate was not performed.

The substrate was exposed to a hot hydrogen atmosphere in a conveyor hydrogen furnace type 47-MT-6482-20AMC-36. The conveyor speed was 11.5 in/min. The oxygen level was about 3.1 ppm; the hydrogen level was about 210 SCFH. The time-temperature profile is the same as provided in FIG. 2.

EVALUATION

After running the substrates of the above examples through the furnace, they were evaluated by scanning electron microscopy. The photoresist was essentially completely removed from the substrate. Microprobes found no trace of organic material. Also, since photoresists fluoresce when exposed to ultraviolet light, the work pieces were viewed under ultraviolet light. No photoresist was detected.

While the method has been described for stripping photoresists, it can also be used to strip organic coatings generally, and polyisoprene coatings in particular. Although certain embodiments of this invention have been shown and described, various adaptations and modifications can be made without departing from the scope of the invention as defined in the appended claims.

What is claimed is:

1. A method for stripping photoresist from a substrate without using organic solvent, comprising the following steps:

a. providing a substrate coated with a negative photoresist;

b. placing said substrate in a hydrogen atmosphere furnace;

c. exposing said substrate to a hot hydrogen atmosphere of a hydrogen atmosphere furnace at a temperature of at least about 430° C. for sufficient time to remove the photoresist, wherein the oxygen content inside the furnace does not exceed about 10 parts per million and further wherein the photoresist is essentially completely stripped by said hot hydrogen atmosphere, without using organic solvent.

2. The method of claim 1 wherein the hydrogen furnace is a conveyor furnace.

3. The method of claim 1 wherein the temperature is from about 445° C. to about 470° C.

4. The method of claim 1 wherein the time is from about 1 to about 4 minutes.

5. The method of claim 1, wherein the photoresist of step (a) is a photo patterned photoresist.

6. The method of claim 1, wherein the photoresist has a average molecular weight of about 60,000.

7. The method of claim 1 wherein the substrate is a metallized ceramic substrate.

8. The method of claim 7 wherein the metallization on the substrate comprises chromium.

9. The method of claim 7 wherein the metallization on the substrate comprises copper.

10. The method of claim 1 wherein the substrate is a metallized ceramic polyimide substrate.

11. The method of claim 10 wherein the metallization on substrate comprises chromium.

12. The method of claim 10 wherein the metallization on the substrate comprises copper.

* * * * *